US012000036B2

(12) United States Patent
Tonai

(10) Patent No.: US 12,000,036 B2
(45) Date of Patent: Jun. 4, 2024

(54) SUBSTRATE TREATING APPARATUS AND SUBSTRATE TREATING METHOD

(71) Applicant: SCREEN Holdings Co., Ltd., Kyoto (JP)

(72) Inventor: Hirofumi Tonai, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 17/524,797

(22) Filed: Nov. 12, 2021

(65) Prior Publication Data
US 2022/0170147 A1    Jun. 2, 2022

(30) Foreign Application Priority Data

Nov. 30, 2020  (JP) ................................. 2020-198316

(51) Int. Cl.
*C23C 14/35* (2006.01)
*B25B 11/00* (2006.01)
*C23C 14/50* (2006.01)

(52) U.S. Cl.
CPC ............ *C23C 14/351* (2013.01); *B25B 11/00* (2013.01); *C23C 14/505* (2013.01)

(58) Field of Classification Search
CPC ....... B25B 11/00; B25B 11/005; B25B 11/02; C23C 14/351; C23C 14/505; H01L 21/68728
(Continued)

(56) References Cited

U.S. PATENT DOCUMENTS 9,732,416 B1 *  8/2017  Stephens ............. C23C 16/4584
2011/0253181 A1   10/2011  Obweger et al. ............. 134/157
(Continued)

FOREIGN PATENT DOCUMENTS

JP      2001-217220 A    8/2001
JP      2008-130948 A    6/2008
(Continued)

OTHER PUBLICATIONS

Notice of Allowance dated Apr. 12, 2023 for corresponding Taiwan Patent Application No. 110142888.
(Continued)

*Primary Examiner* — Lee D Wilson
*Assistant Examiner* — Sidney D Full
(74) *Attorney, Agent, or Firm* — OSTROLENK FABER LLP

(57) ABSTRACT

Disclosed is a substrate treating apparatus for performing a predetermined treatment on a substrate. The apparatus includes: a holding mechanism including a plurality of support pins configured to rotate between a holding position and a delivery position, a first magnetic part configured to rotate the support pins individually between the holding position and the delivery position by switching surrounding magnetic poles, and a second magnetic part configured to rotate the support pins individually to the holding position by constantly applying a magnetic field to the first magnetic part; and a switching mechanism configured to apply no magnetic field of a third magnetic part to the first magnetic part normally and apply a magnetic field of the third magnetic part to the first magnetic part to rotate the support pins individually to the delivery position only when the substrate is delivered.

10 Claims, 8 Drawing Sheets

(58) Field of Classification Search
USPC .......................................... 269/8, 289 R, 903
See application file for complete search history.

(56) References Cited

U.S. PATENT DOCUMENTS

| | | | |
|---|---|---|---|
| 2013/0255031 A1 | 10/2013 | Nishiyama | ..................... 15/383 |
| 2017/0092532 A1* | 3/2017 | Kaba | ................. H01L 21/67051 |
| 2018/0315624 A1 | 11/2018 | Nakamura et al. | |
| 2020/0361141 A1* | 11/2020 | Stadlmayr | ............. B29C 64/153 |

FOREIGN PATENT DOCUMENTS

| | | |
|---|---|---|
| JP | 2014-146747 A | 8/2014 |
| JP | 2020-047719 A | 3/2020 |
| KR | 10-2011-0134435 A | 12/2011 |
| KR | 10-2017-0038171 A | 4/2017 |
| TW | 201340190 A | 10/2013 |
| TW | 201843730 A | 12/2018 |

OTHER PUBLICATIONS

Office Action dated Aug. 12, 2023 for corresponding Korean Patent Application No. 10-2021-0166811.
Office Action dated Apr. 2, 2024 for corresponding Japanese Patent Application No. 2020-198316.

* cited by examiner

SUBSTRATE TREATING APPARATUS AND SUBSTRATE TREATING METHOD

BACKGROUND OF THE INVENTION

(1) Field of the Invention

The present invention relates to a substrate treating apparatus and a substrate treating method for performing a predetermined treatment on a substrate, such as a semiconductor wafer, a substrate for a liquid crystal display or for an organic electroluminescence (EL) display, a glass substrate for photomask, an optical disk substrate, a magnetic disk substrate, a ceramic substrate, a substrate for a solar cell, or the like (hereinafter, simply referred to as substrate) while rotating the substrate supported on a spin table.

(2) Description of the Related Art

A currently-used apparatus of this type includes a spin table, a motor, a treatment liquid supplying nozzle, a plurality of support pins, a first lifting plate, a spring, a cam plate, a shaft, a second lifting plate, and an air cylinder. See, for example, Japanese Unexamined Patent Application Publication No. 2014-146747 (FIG. 2).

The substrate treating apparatus supports a substrate on a top face of the spin table with use of the plurality of support pins. A rear face of the substrate is spaced apart from the top face of the spin table. The substrate treating apparatus supplies a treatment liquid to the substrate through a treatment liquid supplying nozzle while rotating the substrate along with the spin table by the motor. Thereby, a predetermined treatment is performed on the substrate.

The plurality of support pins is attached adjacent to an outer circumference of the spin table so as to be rotatable around a vertical axis. The support pins can each be rotatable between a holding position for supporting while contacting a periphery edge of the substrate and a delivery position for delivering the substrate. The support pins each have a body part to which a shaft is attached to protrude horizontally. The shaft is inserted into a hole of the cam plate. The cam plate is connected to the first lifting plate. The first lifting plate has a top face connected to the lower face of the spin table with the spring. Here, the spring is a compression coil spring and is biased downward such that the first lifting plate is normally spaced apart from the lower face of the spin table. This causes the first lifting plate to be biased downward normally. Consequently, the cam plate is moved downward, and the support pins are rotated into the holding position normally.

The first lifting plate has a magnet attached to a lower face thereof. The second lifting plate is spaced apart below the first lifting plate. The second lifting plate has a magnet attached to a top face thereof. The magnets of the first lifting plate and the lifting plate are arranged such that poles thereof repelling each other face each other. The second lifting plate is moved between positions closer to and further from the first lifting plate than the air cylinder. Normally, an operating shaft of the air cylinder retracts so that the second lifting plate is located at a position further from the first lifting plate. When a substrate is delivered, the air cylinder causes the second lifting plate to move to a position close to the first lifting plate. Accordingly, the first lifting plate is repelled by a magnetic force to compress the spring, and the cam plate is lifted upward. The support pins are each rotated accordingly to the delivery position.

In the substrate treating apparatus having such a construction, the support pins are each kept in the holding position normally. Consequently, even if the operating shaft of the air cylinder is contracted due to failure of the air cylinder, power failure, and the like, the substrate on the spin table is kept held. As a result, there is no possibility that the substrate is removed from the spin table, leading to an advantage to prevent damages on the substrate.

However, the conventional example with such a construction has the following problems. Specifically, the currently-used apparatus holds the substrate normally with an elastic force of the spring and releases holding of the substrate by cancelling the holding by the elastic force with use of a magnetic force. As a result, such a construction as the spring, the cam plate, and the lifting plate is needed, leading to a complicated configuration of the spin table and thus an increased weight. Moreover, the spin table has to be removed when maintenance is performed to replace a plurality of support pins that need to be replaced periodically. Since the spin table is heavy, the burden on an operator at the time of the maintenance also increases.

SUMMARY OF THE INVENTION

The present invention has been made regarding the state of the art noted above, and one object is to provide a substrate treating apparatus that allows holding of a substrate normally and achieves reduction in weight of a spin table with a simple construction.

Moreover, the present invention has been made regarding the state of the art noted above, and the other object is to provide a substrate treating method that allows holding and release of a substrate by rotation with a magnetic force only.

The present invention is constituted as stated below to achieve the above objects.

(1) A first aspect of the present invention provides a substrate treating apparatus that performs a predetermined treatment on a substrate. The apparatus includes: a spin table configured to be rotatable around a vertical axis; a rotational driving device configured to rotate the spin table in a horizontal plane; a holding mechanism configured to hold a substrate in a horizontal posture while the substrate is spaced apart from a top face of the spin table, the holding mechanism including a plurality of support pins provided so as to be rotatable freely around the vertical axis on a part of the top face of the spin table adjacent to an outer circumference, and configured to rotate between a holding position contacting a periphery edge of a substrate for restricting movement of the substrate in a horizontal direction and a delivery position spaced apart from the periphery edge of the substrate for allowing movement of the substrate, a first magnetic part configured to rotate the support pins individually between the holding position and the delivery position by switching surrounding magnetic poles, and a second magnetic part configured to rotate the support pins individually to the holding position by constantly applying a magnetic field to the first magnetic part; and a switching mechanism provided with a third magnetic part having a larger magnetic force than that of the second magnetic part and configured to apply no magnetic field of the third magnetic part to the first magnetic part normally and apply a magnetic field of the third magnetic part to the first magnetic part to rotate the support pins individually to the delivery position only when the substrate is delivered.

According to the first aspect of the present invention, the switching mechanism applies no magnetic field of the third magnetic part to the first magnetic part normally, and applies a magnetic field of the third magnetic part to the first magnetic part to rotate the support pins individually to the delivery position only when the substrate is delivered. Consequently, the support pins are individually rotated into the holding position normally by the magnetic force from the second magnetic part. On the other hand, the support pins are individually rotated into the delivery position by the magnetic force from the third magnetic part of the switching mechanism only when the substrate is delivered. As a result, the spring, the cam plate, the lifting plate, and the like are not necessary, achieving reduction in weight of the spin table with a simple construction. Moreover, along with the reduction in weight of the spin table, the spin table can be removed easily when maintenance is performed to replace a plurality of support pins that need to be replaced periodically. Accordingly, the burden on an operator at the time of the maintenance can also decrease.

(2) It is preferred in the first aspect of the present invention that the first magnetic part and the second magnetic part are located concyclically around a rotation center of the spin table in plan view.

The first magnetic part and the second magnetic part are each positioned visibly from an outer circumference side. This achieves easy operation during maintenance.

(3) It is preferred in the first aspect of the present invention that the first magnetic part is connected to lower ends of the support pins protruding on a lower face of the spin table, and that the second magnetic part is located on the lower face of the spin table laterally of the first magnetic part.

Magnetic force of the second magnetic part is applied to the first magnetic part laterally. Consequently, the degree of rotation when the support pins are located at the holding position can be easily controlled with the position of the second magnetic part.

(4) It is preferred in the first aspect of the present invention that the switching mechanism includes a lifting mechanism configured to move the third magnetic part upward and downward, and that the lifting mechanism rotates the support pins to the delivery position by approaching the third magnetic part to the first magnetic part through upward movement, and rotates the support pins to the holding position by moving the third magnetic part away from the first magnetic part through downward movement, and that the downward movement is performed normally.

The support pins are individually rotated into the delivery position by the upward movement of the third magnetic part with the lifting mechanism of the switching mechanism, and the support pins are rotated into the holding position through the downward movement. Since the downward movement is performed normally, the support pins are individually kept at the holding position even when the lifting mechanism stops operating due to power failure or other reasons, and then moves downward. As a result, there is no possibility that the substrate is removed from the spin table, leading to prevention of damages on the substrate.

(5) It is preferred in the first aspect of the present invention that the third magnetic part is located closer to the rotation center of the spin table than the first magnetic part and the second magnetic part in plan view.

The third magnetic part can be located adjacent to the rotation center of the spin table. Consequently, reduction in size of the switching mechanism is obtainable.

(6) It is preferred in the first aspect of the present invention that the substrate treating apparatus further includes a cover that is located so as to cover the rotational driving device below the spin table and has resistance to a treatment liquid supplied to the substrate, and that the third magnetic part is located within the cover.

Since the third magnetic part is located within the cover, there is no need to apply chemical resistance to the third magnetic part. This can achieve suppressed costs.

(7) It is preferred in the first aspect of the present invention that the spin table has a plurality of through holes penetrating from the top face to the lower face thereof, into which the support pins are individually inserted, and that the spin table includes notches that are formed such that portions thereof around the through holes are each lower than the top face and are cut out toward an outer circumferential face of the spin table.

Since the treatment liquid is easily discharged laterally from the notches, the treatment liquid flowing laterally from the top face of the spin table can be prevented from stagnating at portions where the support pins are attached. This can prevent generation of particles caused by the stagnated treatment liquid.

(8) It is preferred in the first aspect of the present invention that the spin table includes a carrier plate on a lower face of arrangement of the support pins that is configured to support the support pins, the carrier plate includes a first end along an arc of the spin table, a second end opposite to the first end relative to the arc of the spin table, an attachment part for the support pins, the attachment part being formed adjacent to the first end, a round screw hole formed adjacent to the first end and configured to perform screwing and fixation to the spin table, a long threaded screw hole having a longitudinal axis in a radial direction of the spin table, formed adjacent to the second end, and configured to perform screwing to the spin table, and the first end is moved in the radial direction of the spin table while a screw in the long threaded screw hole is released for adjusting positions of the support pins in the radial direction of the spin table.

The first end is moved in the radial direction of the spin table while the screw in the long threaded screw hole of the carrier plate is released, thereby achieving adjustment of the positions of the support pins in the radial direction of the spin table. Consequently, the support pins are easily adjustable such that the substrate is held suitably in the radial direction. In other words, easy adjustment is achieved so as to eliminate so-called core blurring. This results in enhanced in-plane uniformity of the treatment.

(9) It is preferred in the first aspect of the present invention that the support pins each include a cylindrical shaft, and a support piece formed on an upper portion of the shaft and configured to contact the rear face and the outer periphery edge adjacent to the outer circumference side of the substrate to support the substrate, and that the support piece has an elliptical shape in plan view, and a longitudinal axis of the support piece is brought into a posture along the outer periphery of the spin table when the support pins are rotated into the holding position.

The support pins rotate into the holding position, whereby the longitudinal axis of the support piece is brought into the posture along the outer periphery edge of the spin table. Consequently, air resistance in the support piece can be reduced when the spin table rotates, and turbulence of air flow around the support pins can be suppressed. This results in suppression of uneven treatment at the peripheral edge of the substrate adjacent to the support pins.

(10) A second aspect of the present invention provides a substrate treating method for performing a predetermined treatment on a substrate with a substrate treating apparatus by rotating a spin table while a rotational driving device rotates the spin table in a horizontal plane in such a condition where a holding mechanism holds the substrate spaced apart from the spin table, the apparatus including: the holding mechanism including a plurality of support pins provided so as to be rotatable freely around a vertical axis on a part of a top face of the spin table adjacent to an outer circumference, and configured to rotate between a holding position contacting a periphery edge of a substrate for restricting movement of the substrate in a horizontal direction and a delivery position spaced apart from the periphery edge of the substrate for allowing movement of the substrate, a first magnetic part configured to rotate the support pins individually between the holding position and the delivery position by switching surrounding magnetic poles; and a second magnetic part configured to rotate the support pins individually to the holding position by constantly applying a magnetic field to the first magnetic part; and a switching mechanism including a third magnetic part having a larger magnetic force than that of the second magnetic part, the method includes: a delivering step of delivering a substrate by applying a magnetic field of the third magnetic part to the first magnetic part to rotate the support pins into the delivery position individually; a holding step of holding the substrate by rotating the support pins into the delivery position individually while the magnetic field of the third magnetic part is not applied to the first magnetic part; and a treating step of performing a treatment on the substrate.

According to the second aspect of the present invention, the substrate is delivered by rotating the support pins into the delivery position individually while the magnetic field of the third magnetic part is applied to the first magnetic part, and the substrate is held by rotating the support pins into the holding position individually with the second magnetic part while the magnetic field of the third magnetic part is not applied to the first magnetic part. Then, the substrate is treated under such a condition. Accordingly, the substrate can be held and released by rotation only with a magnetic force.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

The following describes one embodiment of the present invention with reference to drawings.

Figure 1:
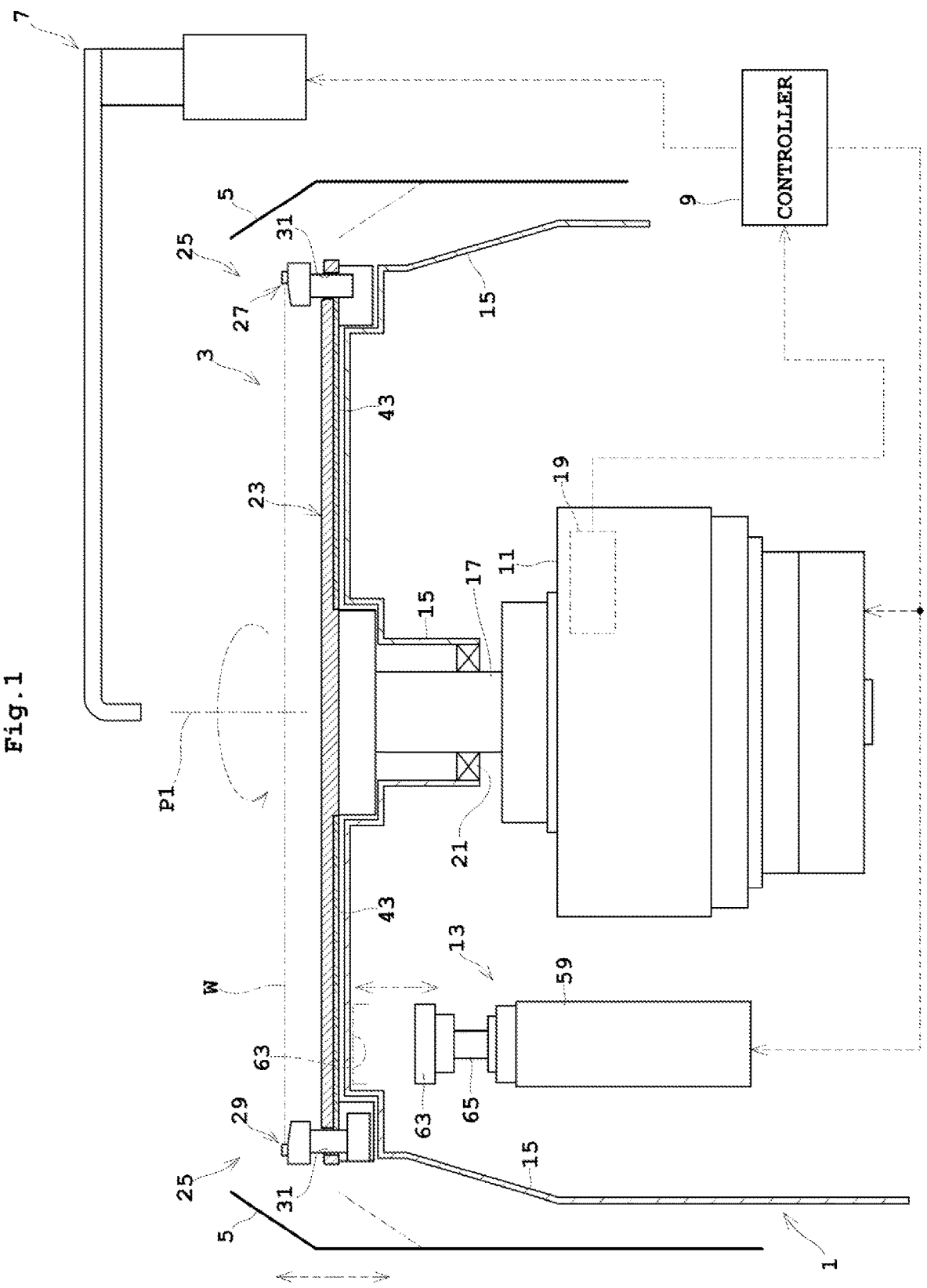
FIG. 1 illustrates an overall configuration of a substrate treating apparatus according to one embodiment of the present invention.
Figure 2A:
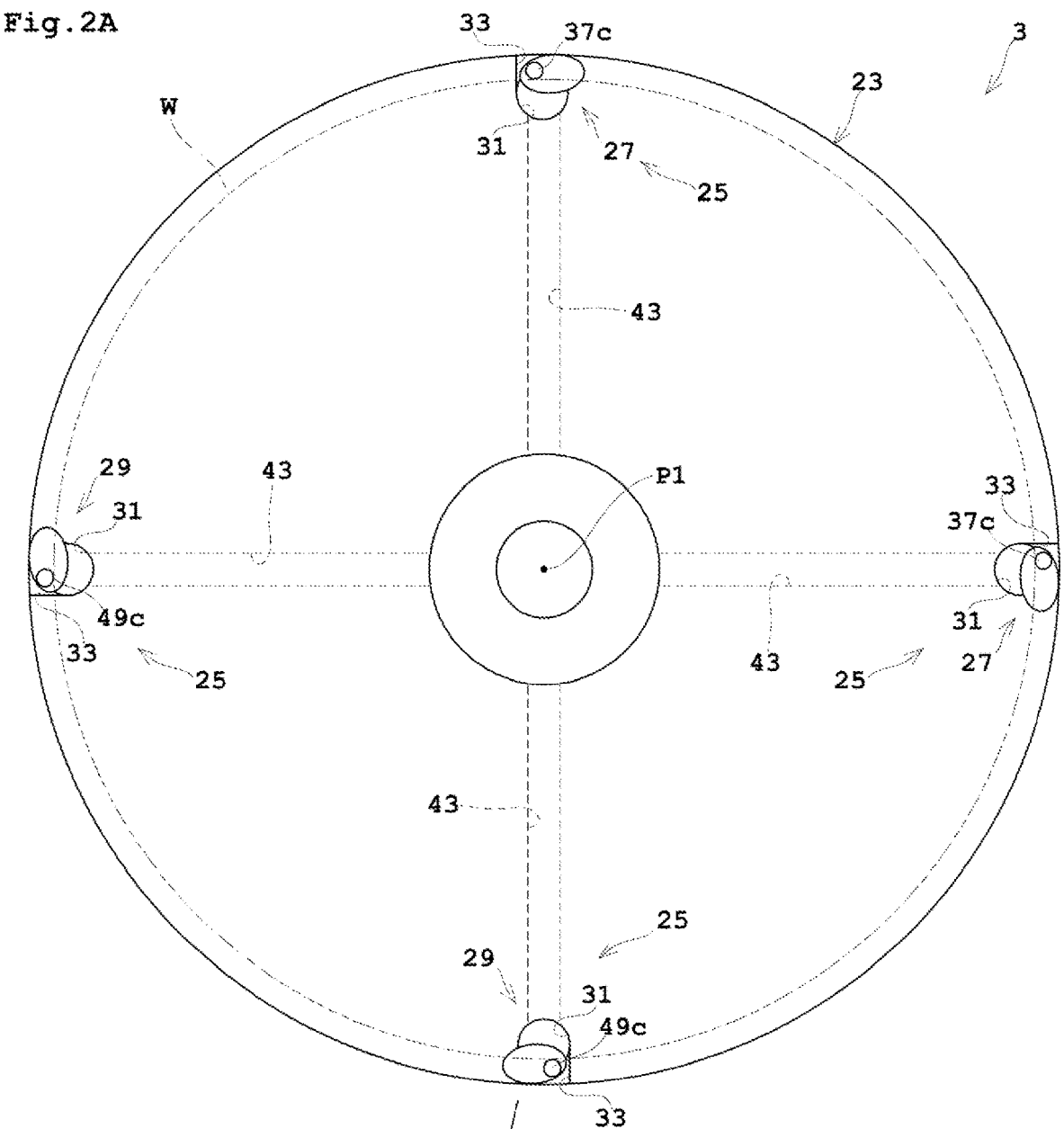
FIG. 2A is a plan view of an overall spin table.
Figure 2B:
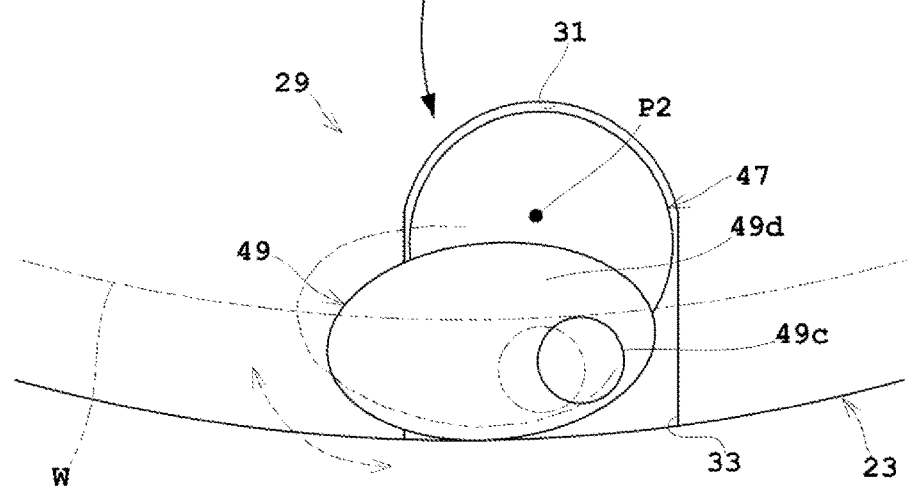
FIG. 2B is a partially enlarged view thereof.
Figure 3A:
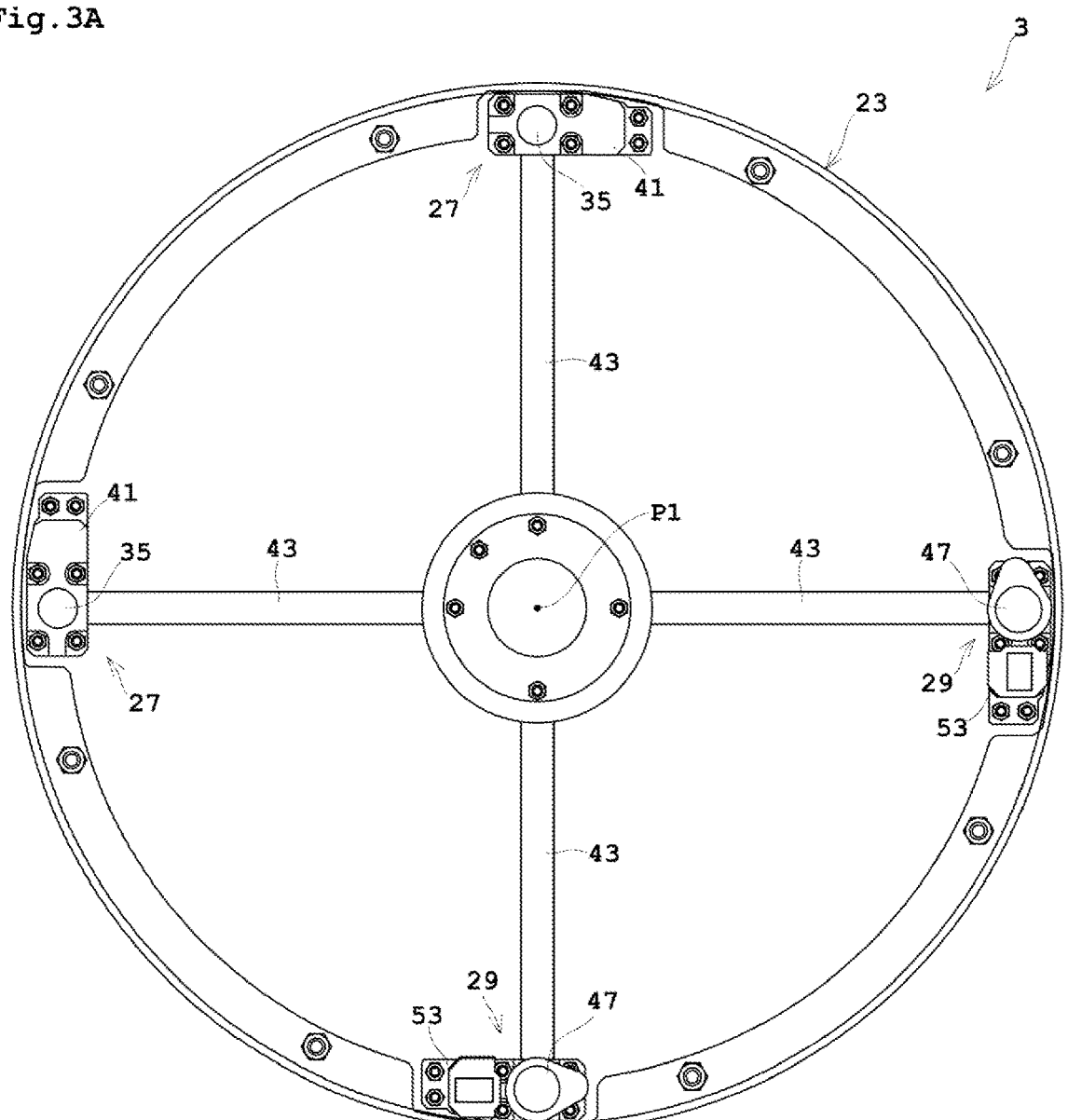
FIG. 3A is a bottom view of the overall spin table.
Figure 3B:
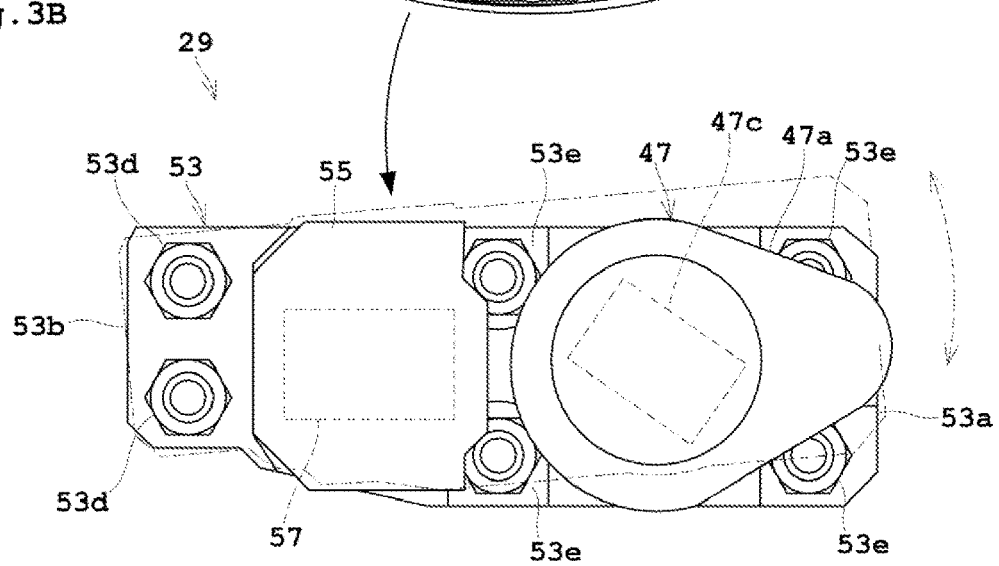
FIG. 3B is a partially enlarged view thereof.

FIG. 1 illustrates an overall configuration of a substrate treating apparatus according to one embodiment of the present invention. FIG. 2A is a plan view of an overall spin table, and FIG. 2B is a partially enlarged view thereof. FIG. 3A is a bottom view of the overall spin table, and FIG. 3B is a partially enlarged view thereof.

The substrate treating apparatus according to the embodiment is a single-wafer processing apparatus for treating substrates W one by one. The substrate treating apparatus includes a base unit 1, a chuck unit 3, a scattering prevention cup 5, a supply nozzle 7, and a controller 9.

The base unit 1 rotates the chuck unit 3, and releases holding of a substrate W held by the chuck unit 3. The chuck unit 3 rotates while holding the substrate W in a horizontal posture. The scattering prevention cup 5 prevents scattering of a treatment liquid, supplied from the supply nozzle 7 to the substrate W, to the surrounding. The scattering prevention cup 5 moves vertically between a treatment level (denoted by solid lines in FIG. 1) and a delivering level (denoted by chain double-dashed lines in FIG. 1), that is below the treatment level.

The base unit 1 includes an electric motor 11 and a switching mechanism 13. The electric motor 11 and the switching mechanism 13 are located inside of a cover 15 having chemical resistance. In other words, the cover 15 covers the electric motor 11 and the switching mechanism 13. Since the electric motor 11 and the switching mechanism 13 are located inside of the cover 15, there is no need that the electric motor 11 and the switching mechanism 13 are treated to be resistant to a treatment liquid or formed with a material resistant to a treatment liquid. Therefore, cost reduction of the base unit 1 is obtainable.

The electric motor 11 includes a rotary shaft 17 in a vertical direction. The rotary shaft 17 rotates around a shaft axis P1 along the vertical direction. The rotary shaft 17 is made of a conductive metallic material. The rotary shaft 17 is electrically connected to a grounding conductor, not shown, for conduction. The electric motor 11 outputs a rotation position of the rotary shaft 17 from an encoder 19. The rotary shaft 17 is supported by a bearing 21 so as to be rotatable, and extends upward from the cover 15. The chuck unit 3 is attached to an upper part of the rotary shaft 17.

The chuck unit 3 described above corresponds to the "holding mechanism" in the present invention, and the electric motor 11 corresponds to the "rotational driving device" in the present invention.

The chuck unit 3 includes a spin table 23 and a holding mechanism 25. The spin table 23 is circular in plan view as shown in FIG. 2A. The spin table 23 is formed by a material resistant to a treatment liquid supplied from the supply nozzle 7, for example. Specifically, a fluororesin is cited as the material. More specifically, polyether ether ketone (PEEK) is cited.

The holding mechanism 25 includes two stationary pins 27 and two movable pins 29, for example. The spin table 23 has through holes 31 positioned so as to correspond to the two stationary pins 27 and the two movable pins 29. The through holes 31 each penetrate from a top face to a lower face of the spin table 23. The two stationary pins 27 and the two movable pins 29 are inserted into the through holes 31 individually. The spin table 23 has notches 33 formed around the through holes 31 individually. The notches 33 are formed lower in level than the top face of the spin table 23. The notches 33 each have a U-shape in plan view.

The notches 33 allow easy discharge of the treatment liquid laterally. Consequently, the treatment liquid flowing laterally from the top face of the spin table 23 can be prevented from stagnating at portions where the stationary pins 27 and the movable pins 29 are attached. This can prevent generation of particles caused by the stagnated treatment liquid.

Here, the stationary pin 27 and the movable pin 29 described above correspond to the "support pin" in the present invention.

Figure 4:
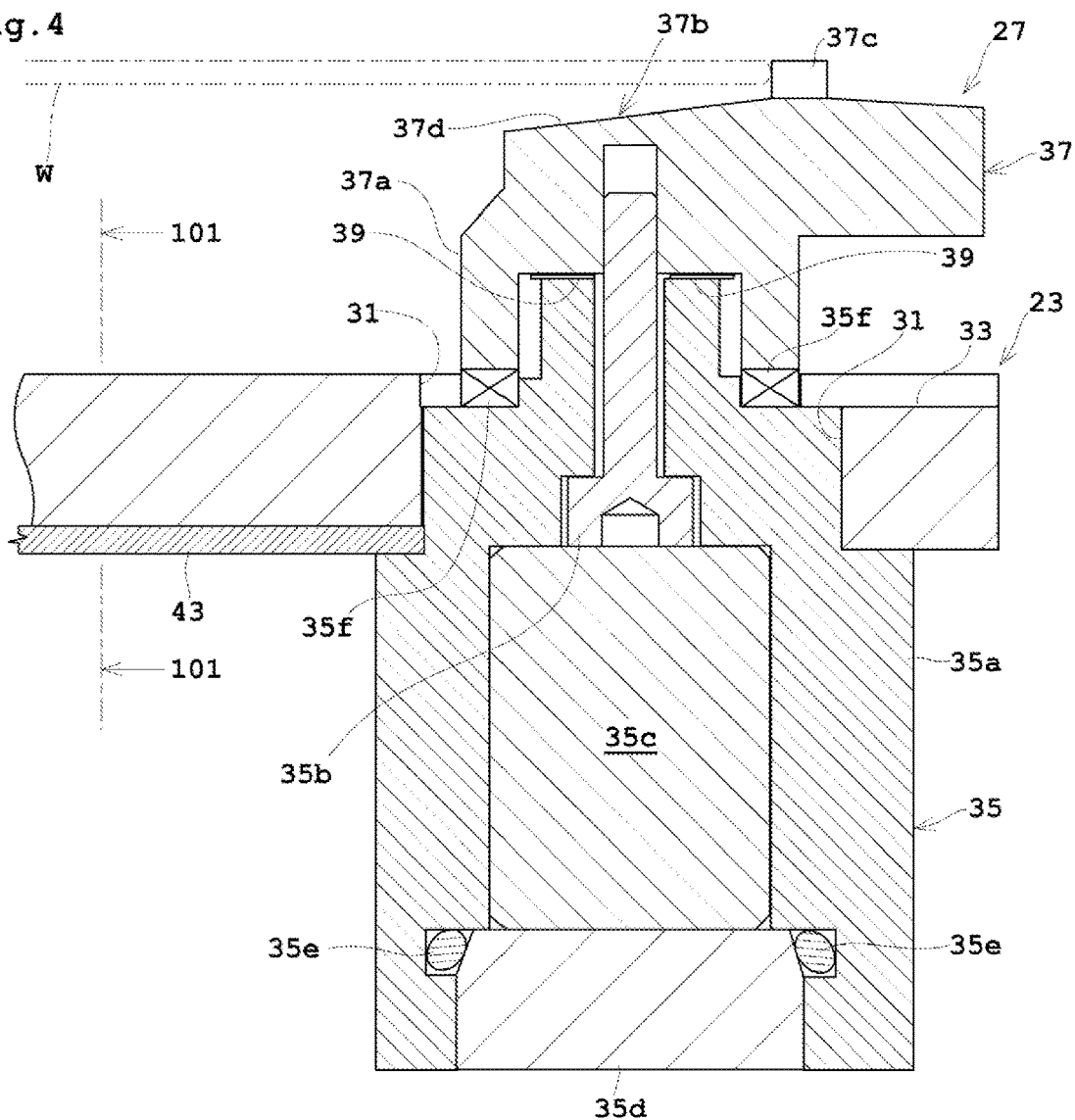
FIG. 4 is a longitudinal sectional view of a stationary pin.

Reference is now made to FIG. 4. FIG. 4 is a longitudinal sectional view of the stationary pin.

The stationary pin 27 includes a bottom pin section 35 and a top pin section 37. The bottom pin section 35 is provided below the spin table 23. The bottom pin section 35 is coupled to the top pin section 37 via the through hole 31. The bottom pin section 35 includes a pin supporting portion 35a, a fixing screw 35b, a balance weight 35c, a lid member 35d, and a fixing seal 35e. The fixing screw 35b for fixing the top pin section 37 to the pin supporting portion 35a is screwed into an upper part of the pin supporting portion 35a. The balance weight 35c is attached to a lower part of the fixing screw 35b. The balance weight 35c balances the weight with the movable pin 29. The lid member 35d is attached to a lower part of the balance weight 35c. The lid member 35d fixes the balance weight 35c to the pin supporting portion 35a. The lid member 35d is fixed to the pin supporting portion 35a via the fixing seal 35e. The top pin section 37 is attached to the upper part of the pin supporting portion 35a via a fixing seal 35f. The fixing seal 35f prevents the treatment liquid from entering the inside to corrode the fixing screw 35b, and the like.

The top pin section 37 includes a shaft 37a and a support piece 37b. The support piece 37b includes a projection 37c. The shaft 37a is fixed to the pin supporting portion 35a via the fixing screw 35b while being placed on the fixing seal 35f. The support piece 37b has a substantially ellipse shape in plan view. The support piece 37b supports a substrate W by contacting a rear face adjacent to the outer circumference and an outer periphery edge of the substrate W. The support piece 37b has a slope face 37d adjacent to the shaft axis P1. The slope face 37d has a slope gradually increasing in level from the shaft axis P1 toward the outer circumference of the spin table 23. The slope face 37d contacts the rear face of the substrate W. The projection 37c is formed on the support piece 37b closer to the outer circumference of the spin table 23 than the fixing screw 35b in plan view. The projection 37c contacts the outer periphery edge of the substrate W to restrict outward movement of the substrate W. The stationary pin 27 is attached such that an ellipse longitudinal axis of the support piece 37b is brought into a posture along the outer periphery edge of the spin table 23.

In the stationary pin 27, a shim 39 can be inserted into a contact portion between the top pin section 37 and the top face of the pin supporting portion 35a. The shim 39 is a thin stainless steel plate. Replacing the shim 39 by one having a different thickness or increasing or decreasing the number of shims 39 can adjust a level of the top pin section 37 from the top face of the spin table 23 in the stationary pin 27. Accordingly, the level where the substrate W is supported is adjustable, and thus the substrate W is adjustable to be horizontal. The fixing seals 35e and 35f are each an elastic member having chemical resistance. Specifically, the fixing seals 35e and 35f are preferably made from a fluororubber (vinylidene fluoride (FKM), tetrafluoroethylene-propylene (FEPM), tetrafluoroethylene-perfluorovinyl ether (FFKM) or the like), for example.

As shown in FIG. 3A, the bottom pin section 35 of the stationary pin 27 is screwed on the lower face of the spin table 23 via a cover 41. Note that the pin cover 41 is not shown in FIG. 4 for the convenience of illustration. The pin supporting portion 35a and the support piece 37b as components of the stationary pin 27 described above are preferably formed by a conductive material having chemical resistance. More preferably, the material is a conductive PEEK material containing carbon nanotubes. This ensures conductivity.

Ground lines 43 are provided on the lower face of the spin table 23. Specifically, as shown in FIGS. 2A and 3A, four ground lines 43 are located so as to conduct the two stationary pins 27 and the two movable pins 29. The ground line 43 has conductivity. Preferably, the material thereof is a conductive PEEK material containing carbon nanotubes. The ground line 43 has a first end, adjacent to the outer circumference, that is attached to conduct the pin supporting portion 35a. The ground line 43 has a second end, adjacent to the shaft axis P1, that is attached to conduct the rotary shaft 17. The rotary shaft 17 is connected to a grounding conductor via the electric motor 11.

Figure 5:
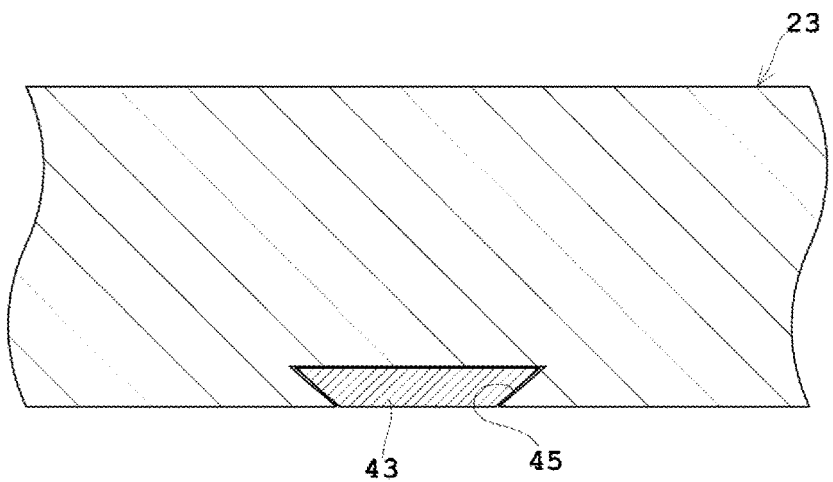
FIG. 5 is a sectional view on arrow 101-101 in FIGS. 4 and 6.

Reference is now made to FIG. 5. FIG. 5 is a sectional view on arrow 101-101 in FIGS. 4 and 6.

The spin table 23 has a groove 45 formed on the lower face thereof so as to have a cross shape in plan view. The groove 45 has an inverted trapezoidal shape in its longitudinal cross section. The ground line 43 described above fits in the groove 45. The ground line 43 has a longitudinal cross section substantially equal to the shape of the groove 45. The ground line 43 has an outer shape slightly smaller than the groove 45. Consequently, the ground line 43 can be attached to the groove 45 by passing the ground line 43 into the groove 45 radially along a surface of the spin table 23. This causes the ground line 43 to pass into the groove 45 loosely. Accordingly, it is possible to prevent a phenomenon (called creep phenomenon), which may occur in the resin material, that the resin material deforms with time due to load application. In this way, such an inconvenience that conduct is hard to perform due to deformation of the ground line 43 can be prevented.

When the spin table 23 is made of a non-conductive material such as PEEK, attached particles may be difficult to detach due to electrostatic charge. This may cause the substrate W to be contaminated with particles. In the present embodiment, arrangement of the ground lines 43 causes grounding of the stationary pins 27 described above and the movable pins 29 to be mentioned below. Accordingly, electrostatic charge can be prevented, and thus the inconvenience described above can be prevented. In addition, the conductive PEEK material containing carbon nanotubes is very expensive. However, in the present embodiment, not entirely but only a part of the spin table 23, which part is cross-shaped in plan view, is made of the conductive PEEK material. This can prevent inconvenience described above while suppressing costs.

Figure 6:
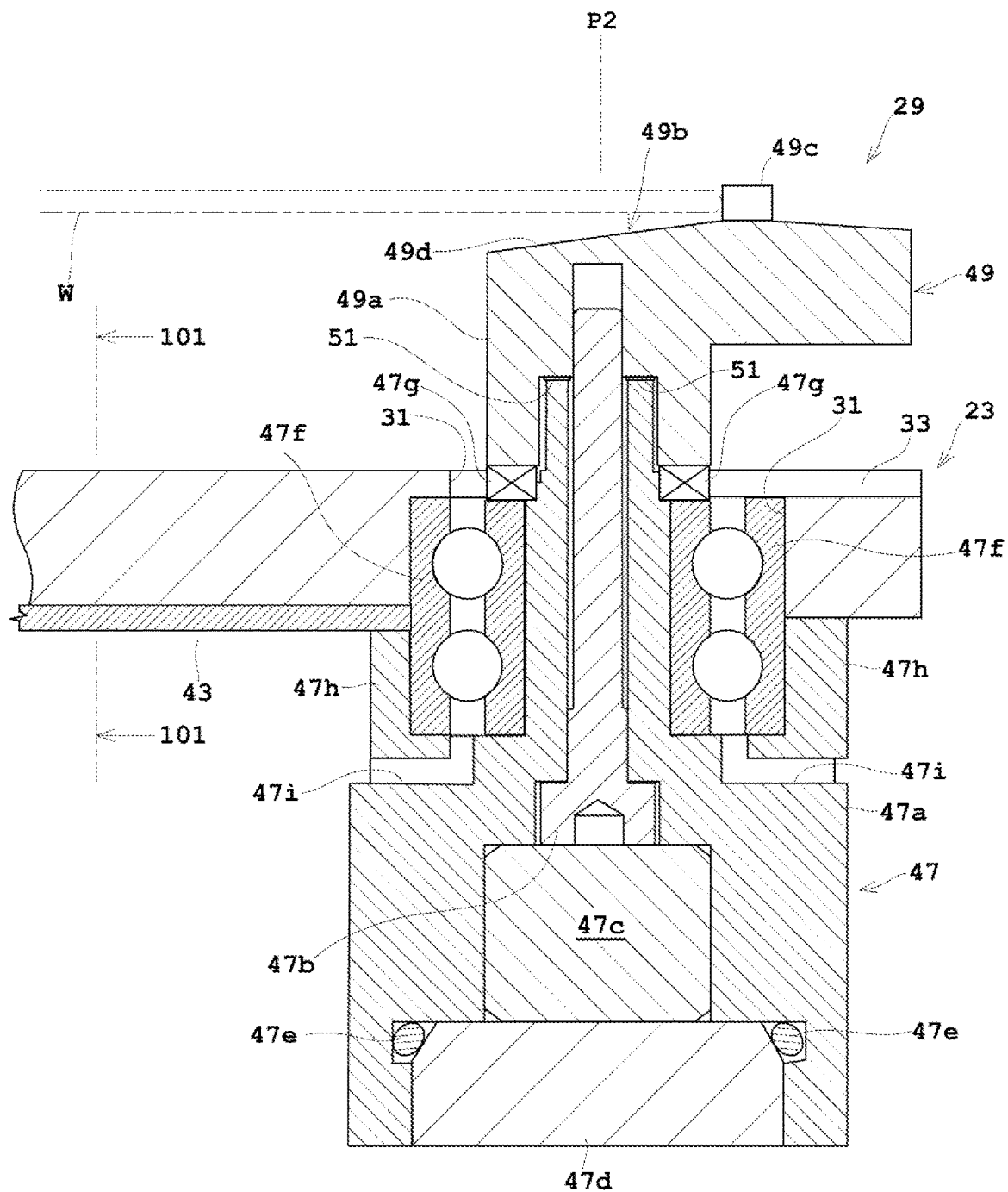
FIG. 6 is a longitudinal sectional view of a movable pin.

Reference is now made to FIG. 6. FIG. 6 is a longitudinal sectional view of the movable pin.

The movable pin 29 includes a bottom pin section 47 and a top pin section 49. The bottom pin section 47 is provided below the spin table 23. The bottom pin section 47 is coupled to the top pin section 49 via the through hole 31. The bottom pin section 47 includes a pin supporting portion 47a, a rotation magnet 47c, a lid member 47d, a fixing seal 47e, a bearing 47f, a fixing seal 47g, and a tubular member 47h.

A fixing screw 47b for fixing the top pin section 49 to the pin supporting portion 47a is screwed into an upper part of the pin supporting portion 47a. The rotation magnet 47c is attached to a lower part of the fixing screw 47b. The rotation magnet 47c is attached to a lower end of the movable pin 29. The rotation magnet 47c is used for rotating the movable pin 29 by switching the surrounding magnetic poles, which is to be mentioned later. The lid member 47d is attached to a lower part of the rotation magnet 47c. The lid member 47d fixes the rotation magnet 47c to the pin supporting portion 47a. The lid member 47d is fixed to the pin supporting portion 47a via the fixing seal 47e. The pin supporting portion 47a is attached to the through hole 31 by the fixing seal 47g via the bearing 47f and the tubular member 47h. The pin supporting portion 47a is fixed only to an inner ring of the bearing 47f, and is not fixed to an outer ring of the bearing 47f. The outer ring of the bearing 47f is fixed to the through hole 31. The tubular member 47h is attached to an upper part of the pin supporting portion 47a while a lower face thereof is spaced apart from the top face of the pin supporting portion 47a.

The tubular member 47h is fixed only to the outer ring of the bearing 47f and the lower face of the spin table 23. The lower face of the tubular member 47h is spaced apart from the pin supporting portion 47a. The bearing 47f does not include a seal member between the inner ring and the outer ring thereof. Accordingly, fluid can pass between the inner ring and the outer ring of the bearing 47f. The bearing 47f is made of a material that is resistant to a treatment liquid. For example, the bearing 47f preferably has the inner ring and the outer ring made of a conductive resin. The bearing 47f is preferably made of, for example, a conductive PEEK material containing carbon nanotubes. Moreover, a rolling element of the bearing 47f is preferably made of silicon carbide (SiC) in view of securing abrasion resistance and conductivity. The fluid flowing on the bearing 47f downward is discharged to the surroundings through a flow path 47i in a gap between the lower face of the tubular member 47h and the pin supporting portion 47a. Consequently, in combination with the effect of the notches 33, the stagnation of the treatment liquid at a root of the movable pin 29 on the spin table 23 can be more effectively prevented.

The top pin section 49 includes a shaft 49a and a support piece 49b. The support piece 49b includes a projection 49c. The shaft 49a is fixed to the pin supporting portion 47a via the fixing screw 47b while being placed on the fixing seal 47g. The support piece 47b has a substantially ellipse shape in plan view. The support piece 47b supports a substrate W by contacting a rear face adjacent to the outer circumference and an outer periphery edge of the substrate W. The support piece 47b has a slope face 49d adjacent to the shaft axis P1. The slope face 49d has a slope gradually increasing in level from the shaft axis P1 toward the outer circumference of the spin table 23. The slope face 49d contacts a rear face of the substrate W. The projection 49c is formed on the support piece 49b closer to the outer circumference of the spin table 23 than the fixing screw 47b in plan view. The projection 49c contacts the outer periphery edge of the substrate W to restrict outward movement of the substrate W. Here, similarly to the stationary pin 27, the movable pin 29 can cause a shim 51 to be inserted into a contact portion between the top pin section 49 and the top face of the pin supporting portion 47a. Replacing the shim 51 by one having a different thickness or increasing or decreasing the number of shims 51 can adjust a level of the top pin section 49 from the top face of the spin table 23 in the movable pin 29. This yields adjustment of a surface level of the substrate W. This is also called camming adjustment. The material of the fixing seals 47e and 47g is preferably the same as that of the fixing seals 35e and 35f described above. The movable pin 29 is configured so as to be rotatable around a shaft axis P2 by the bearing 47f.

As shown in FIGS. 3A and 3B, the bottom pin section 47 of the movable pin 29 is screwed and fixed to the lower face of the spin table 23 via a carrier plate 53. Note that the carrier plate 53 is not shown for the convenience of illustration in FIG. 6. Among the components constituting the movable pin 29 described above, the bottom pin section 47 and the top pin section 37 are preferably made of a conductive material having chemical resistance. More preferably, the material is a conductive PEEK material containing carbon nanotubes. This ensures conductivity.

The movable pin 29 is attached such that an ellipse longitudinal axis of the support piece 49b is brought into a posture along the outer periphery edge of the spin table 23 when the movable pin 29 rotates into the holding position, which is similar to the stationary pin 27. Consequently, the movable pin 29 rotates into the holding position, whereby the longitudinal axes of the support pieces 37b and 49b are each brought into a posture along the outer periphery edge of the spin table 23. Consequently, air resistance in the support pieces 37b and 49b when the spin table 23 rotates can be reduced, and turbulence of air flow around the stationary pin 27 and the movable pin 29 can be suppressed. This results in suppression of uneven treatment around the peripheral edge of the substrate W adjacent to the stationary pin 27 and the movable pin 29.

The ground line 43 shown in FIGS. 2A and 3A has a first end, adjacent to the outer circumference, that is attached to conduct the bottom pin section 47. The ground line 43 has a second end, adjacent to the shaft axis P1, that is attached to conduct the rotary shaft 17.

Figure 7:
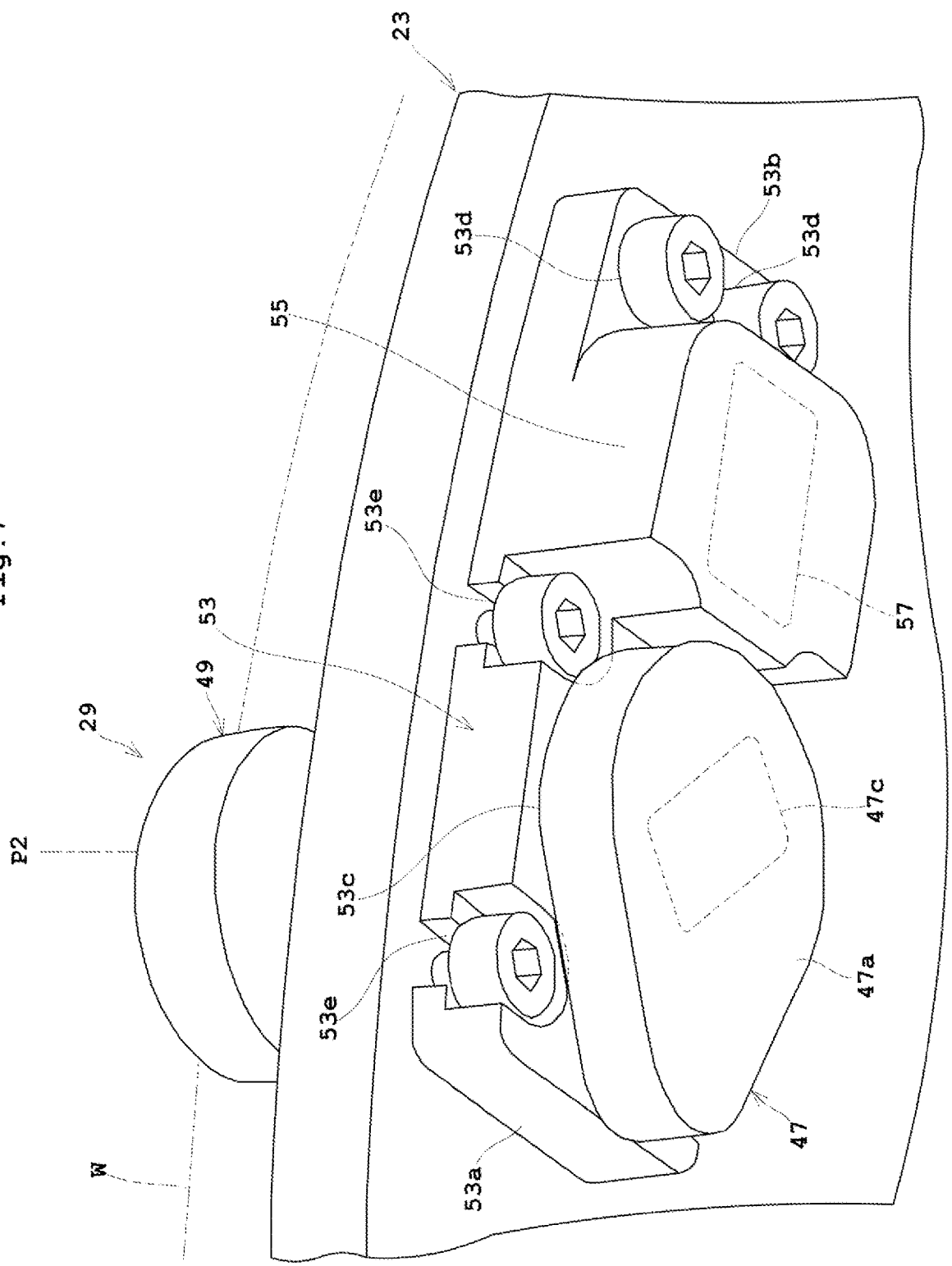
FIG. 7 is a perspective view of the movable pin seen from below.

Reference is now made to FIGS. 3 and 7. FIG. 7 is a perspective view of the movable pin seen from below.

The carrier plate 53 includes a first end 53a, a second end 53b, an attachment part 53c, a round screw hole 53d, and a long threaded screw hole 53e. The carrier plate 53 is made of a material that is resistant to a treatment liquid. The material is preferably a fluororesin. The material is more preferably PEEK.

The first end 53a is a part of the carrier plate 53 along an arc corresponding to the outer periphery edge of the spin table 23. The second end 53b is a part, opposite to the first end 53a, of the arc corresponding to the outer periphery edge of the spin table 23. The attachment part 53c is a part where the movable pin 29 formed adjacent to the first end 53a is attached. The round screw hole 53d is an attachment hole formed adjacent to the second end 53b and configured to perform screwing and fixation to the spin table 23. The long threaded screw hole 53e is an attachment hole formed adjacent to the first end 53a and configured to perform screwing to the spin table 23. The hole is a long hole having a longitudinal axis in the radial direction of the spin table 23.

The carrier plate 53 includes the long threaded screw hole 53e as described above. Accordingly, the first end 53a is moved in the radial direction of the spin table 23 while a screw in the long threaded screw hole 53e is released, whereby the position of the movable pin 29 in the radial direction of the spin table 23 can be adjusted. This can easily perform adjustment such that the substrate W can be held suitably in the radial direction of the spin table 23. In other words, easy adjustment can be performed to eliminate so-called "core blurring" such that the rotation center of the spin table 23 matches the center of the substrate W. This results in enhanced in-plane uniformity of the treatment in the substrate W.

The carrier plate 53 has a housing unit 55 formed at a position adjacent to the attachment part 53c. The housing unit 55 are formed on the lower face of the spin table 23 and laterally of the rotation magnet 47c. The housing unit 55 houses a stationary magnet 57. The stationary magnet 57 constantly applies a magnetic field to the rotation magnet 47c. The rotation magnet 47c to which the stationary magnet 57 applies the magnetic field rotates by being attracted to the fixed magnet 57 by a magnetic force, and is stationary in a stable state. Accordingly, the movable pin 29 rotates around the shaft axis P2 to be stationary. This position corresponds to the holding position. As shown by solid lines in FIG. 2B, the holding position is a position where the projection 49c contacts an edge of the substrate W. On the other hand, the delivery position is a position where the movable pin 29 is rotated around the shaft axis P2, the projection 49c is separated from the edge of the substrate W, and a peripheral edge of a rear face of the substrate W is supported in contact with the slope face 49d, as shown by chain double-dashed lines in FIG. 2B. Consequently, when the movable pin 29 is in the delivery position, the substrate W can be delivered by a transfer arm not shown. Since the stationary magnet 57 is arranged laterally of the rotation magnet 47c, the degree of rotation when the movable pin 29 is rotated into the holding position can be easily adjusted by the position of the stationary magnet 57.

The stationary magnet 57 and the rotation magnet 47c described above are located concyclically around the rotation center P1 of the spin table 23 in plan view, as shown in FIGS. 3A and 3B. With such arrangement, the stationary magnet 57 and the rotation magnet 47c are both visible from the outer circumference as shown in FIG. 7. This achieves easy operation during maintenance.

Figure 8:
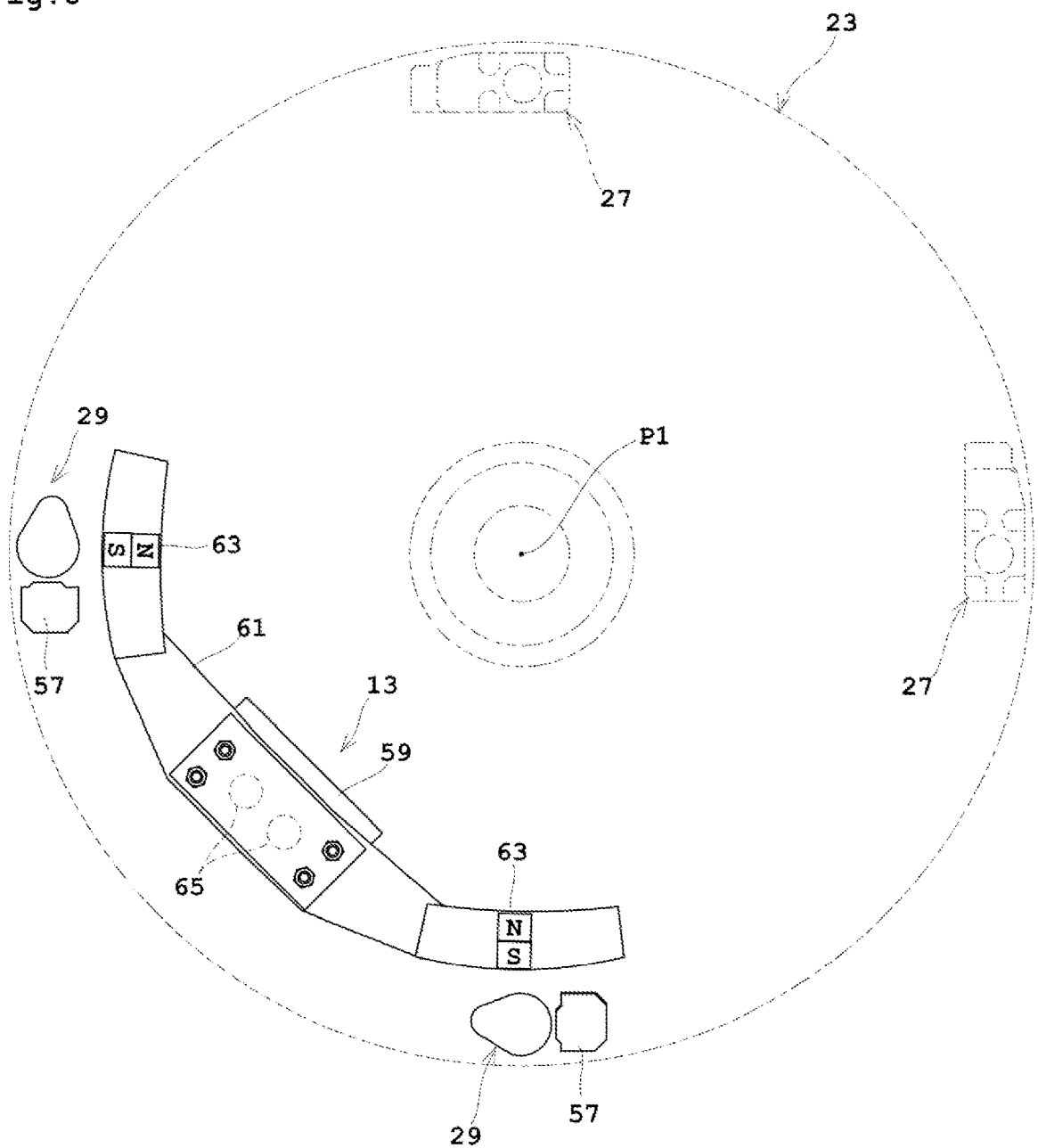
FIG. 8 is a plan view of a switching mechanism.
Figure 9:
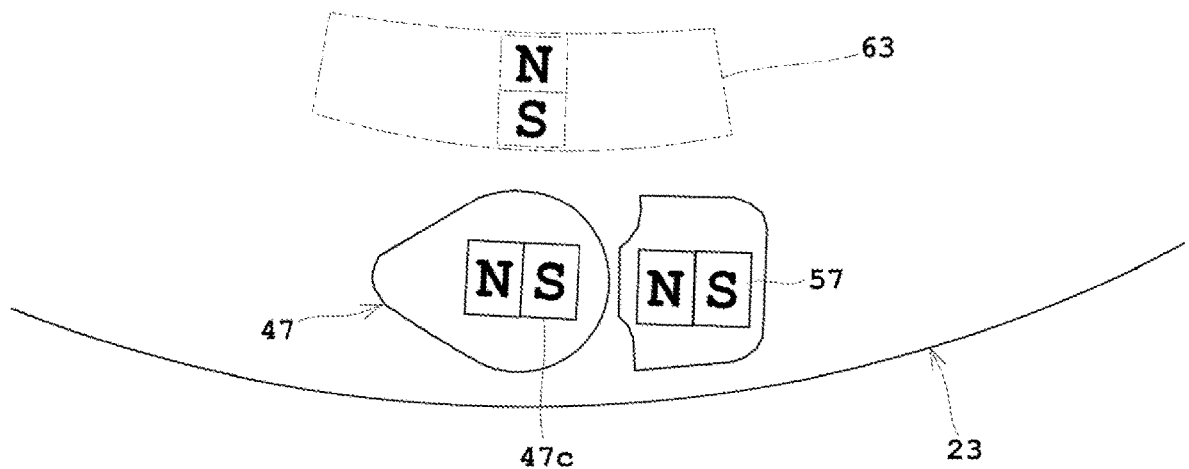
FIG. 9 is a positional relationship of magnets in a holding position of the movable pin.
Figure 10:
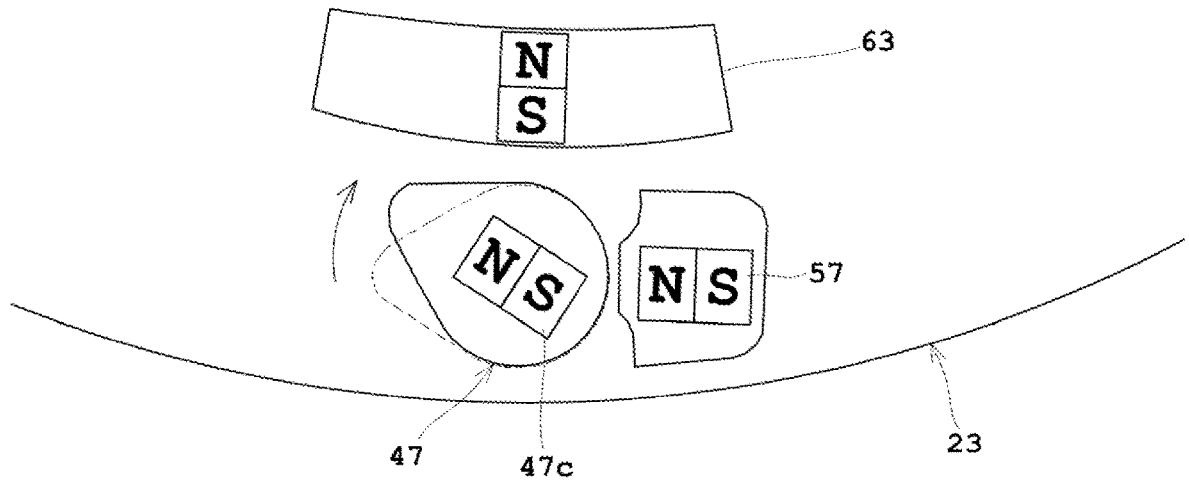
FIG. 10 is a positional relationship of magnets in a delivery position of the movable pin.

Reference is now made to FIG. 1 as well as FIGS. 8 to 10. FIG. 8 is a plan view of the switching mechanism. FIG. 9 is a positional relationship of magnets in the holding position of the movable pin. FIG. 10 is a positional relationship of magnets in the delivery position of the movable pin.

The switching mechanism 13 includes an air cylinder 59, a support arm 61, and drive magnets 63. The air cylinder 59 includes an operating shaft 65 expanding and contracting in the vertical direction. The support arm 61 is attached to the operating shaft 65. The support arm 61 has a length over the two movable pins 29. The drive magnets 63 are attached to both ends of the support arm 61 individually. The drive magnets 63 are each located closer to the inner circumference of the spin table 23 than the rotation magnet 47c in plan view. In other words, the drive magnets 63 are each located closer to the shaft axis P1 of the spin table 23 than the rotation magnet 47c and the stationary magnet 57. The drive magnet 63 generates a stronger magnetic force than that by the stationary magnet 57.

The switching mechanism 13 causes the operating shaft 65 of the air cylinder 59 to contract such that the drive magnet 63 is brought into a lowered position, shown by solid lines in FIG. 1, at the holding position where the substrate W is held. Such a state is caused at a position in a normal state, for example, when the power supply is cut off due to any power failure or power supply trouble. Here, the state has a positional relationship in plan view as shown in FIG. 9. That is, a magnetic force only by the stationary magnet 57 is applied to the rotation magnet 47c of the movable pin 29, and the rotation magnet 47c and the stationary magnet 57 are attracted to each other by the magnetic force, whereby the movable pin 29 is rotated into the holding position.

On the other hand, the switching mechanism 13 causes the operating shaft 65 of the air cylinder 59 to expand such that the drive magnet 63 is brought into a raised position, shown by chain double-dashed lines in FIG. 1, at the delivery position where the substrate W is released. Here, the state has a positional relationship in plan view as shown in FIG. 10. That is, a stronger magnetic force than that applied to the rotation magnet 47c of the movable pin 29 by the stationary magnet 57 is applied from the drive magnet 63 to the rotation magnet 47c. Then, the rotation magnet 47c is attracted to the drive magnet 63, whereby the movable pin 29 are rotated into the delivery position.

It is preferred that the rotation magnet 47c, the stationary magnet 57, and the drive magnet 63 described above are each a neodymium magnet. The neodymium magnet is a rare-earth magnet containing neodymium, iron, and boron as main components. The neodymium magnet generates a strong magnetic field.

The switching mechanism 13 is located closer to the shaft axis P1 of the spin table 23 than the rotation magnet 47c and the stationary magnet 57 in plan view. Consequently, the drive magnet 63 can be located adjacent to the shaft axis P1 of the spin table 23. This can achieve reduction in size of the switching mechanism 13.

Here, the rotation magnet 47c described above corresponds to the "first magnetic part" in the present invention, the stationary magnet 57 corresponds to the "second magnetic part" in the present invention, and the drive magnet 63 corresponds to the "third magnetic part" in the present invention.

The controller 9 is formed by a CPU and a memory, and the like. The controller 9 controls supply of a treatment liquid from the supply nozzle 7 or swing of the supply nozzle 7 between a standby position and a supply position. The standby position corresponds to a position where an ejection port of the supply nozzle 7 is above the shaft axis P1 as shown in FIG. 1. The standby position is a position where the ejection port of the supply nozzle 7 is laterally apart from the scattering prevention cup 5. The controller 9 controls upward and downward movement, i.e., between a treatment level and a delivering level of the scattering prevention cup 5. The controller 9 controls rotation of the electric motor 11. For example, the controller 9 performs control to increase a rotational speed at a predetermined acceleration toward a treatment speed, and to maintain the treatment speed over a treatment period of time when reaching the treatment speed. After the treatment period of time elapses, the controller 9 performs control to decrease a rotational speed at a predetermined negative acceleration to stop rotation. The controller 9 receives a signal from an encoder 19. The controller 9 refers to an output from the encoder 19 when stopping the electric motor 11. The controller 9 stops the electric motor 11 to have the positional relationship shown in FIG. 8. Specifically, rotation of the electric motor 11 is controlled such that rotation magnets 47c of the two movable pins 29 and the drive magnet 63 of the switching mechanism 13 face each other in the radial direction of the spin table 23. The controller 9 controls upward and downward movement of the drive magnet 63 by the switching mechanism 13.

The substrate treating apparatus having the above-described construction performs treatment on the substrate W as under, for example. Here, the controller 9 does not operate the switching mechanism 13 normally. That is, the drive magnet 63 is located at the lowered position shown by solid lines in FIG. 1. In such a normal situation, the rotation magnet 47c is attracted and rotated by a magnetic force of the stationary magnet 57 as shown in FIG. 9. Accordingly, the movable pin 29 is located at the holding position indicated by solid lines in FIG. 2B.

The controller 9 moves the scatter preventive cup to the delivering level, and also operates the switching mechanism 13 to move the drive magnet 63 to the raised position. The raised position is indicated by chain double-dashed lines in FIG. 1. Then, as shown in FIG. 10, the rotation magnet 47c is attracted to the drive magnet 63. Accordingly, the movable pin 29 is moved to the delivery position indicated by chain double-dashed line in FIG. 2B.

The controller 9 moves a transfer arm (not shown), holding the substrate W to be treated, above the spin table 23, and lowers the transfer arm to place the substrate W on the slope face 37d of the stationary pin 27 and the slope face 49d of the movable pin 29.

The above operation corresponds to the "delivering step" in the present invention.

After the transfer arm moves outward, the controller 9 performs control to move the scatter preventive cup upward to the treatment level. The controller 9 operates the switching mechanism 13 to move the drive magnet 63 downward to the lowered position indicated by solid lines in FIG. 1. Then, as shown in FIG. 9, the rotation magnet 47c releases its attraction by the drive magnet 63. Accordingly, the rotation magnet 47c is attracted and rotated by the magnetic force of the stationary magnet 57. This causes the movable pin 29 to be moved to the holding position indicated by solid lines in FIG. 2B.

The above operation corresponds to the "holding step" in the present invention.

The controller 9 operates the supply nozzle 7 so as to swing the supply nozzle 7 from the standby position to the supply position. Then, the controller 9 causes the supply nozzle 7 to supply a treatment liquid to the substrate W for a treatment period of time while the electric motor 11 rotates at a treatment speed.

The above operation corresponds to the "treating step" in the present invention.

After a predetermined period of time elapses, the substrate W is unloaded by reverse operation of a series of the operation described above.

According to the aspect of the present embodiment, the switching mechanism 13 applies no magnetic field of the drive magnet 63 to the rotation magnet 47c normally, and applies a magnetic field of the drive magnet 63 to the rotation magnet 47c to rotate the movable pins 29 individually to the delivery position only when the substrate W is delivered. Consequently, the movable pins 29 are individually rotated into the holding position normally by the magnetic force from the stationary magnet 57. On the other hand, the movable pins 29 are individually rotated into the delivery position by the magnetic force from the drive magnet 63 of the switching mechanism 13 only when the substrate W is delivered. As a result, a spring, a cam plate, a lifting plate, and the like are not necessary, achieving reduction in weight of the spin table with a simple construction. Moreover, along with the reduction in weight of the spin table 23, the spin table 23 can be removed easily when maintenance is performed to replace the two stationary pins 27 and the two movable pins 29 that need to be replaced periodically. Accordingly, the burden on an operator at the time of the maintenance can also decrease.

The present invention is not limited to the foregoing examples, but may be modified as follows.

(1) In the embodiment described above, the rotation magnet 47c and the stationary magnet 57 are located concyclically around the shaft axis P1. However, the present invention is not limitative to this configuration. In other words, the rotation magnet 47c and the stationary magnet 57 may be located in the radial direction of the spin table 23.

(2) In the embodiment described above, the stationary magnet 57 is located laterally of the rotation magnet 47c. However, the present invention is not limitative to this configuration. That is, it is only necessary for the stationary magnet 57 to rotate the movable pin 29 into the holding position by applying a magnetic field to the rotation magnet 47c. Accordingly, the position where the stationary magnet 57 is arranged is not limited.

(3) In the embodiment described above, the switching mechanism 13 is formed by the air cylinder 59. However, the present invention is not limitative to this configuration. That is, the drive magnet 63 may have any construction as long as the drive magnet 63 is movable between a position adjacent to the rotation magnet 47c and a position apart from the rotation magnet 47c.

(4) In the embodiment described above, the spin table 23 includes the notches 33. However, such a construction is not essential in the present invention.

(5) In the embodiment described above, the carrier plate 53 can cause the movable pins 29 to adjust a position in the radial direction of the spin table 23. However, such a construction is not essential to the present invention. This construction may be omitted for cost suppression if so-called core blurring does not significantly affect the treatment.

(6) In the embodiment described above, the stationary pins 27, the movable pins 29, and the support pieces 37b and 49b each have an ellipse shape in plan view. However, the present invention is not limitative to this configuration. For example, the support pieces 37b and 49b may have a circular shape in plan view.

(7) In the embodiment described above, the two stationary pins 27 and the two movable pins 29 are provided in the chuck unit 3. However, the number is not limited in the present invention.

(8) In the embodiment described above, the substrate treating apparatus is exemplified that is configured to perform treatment by supplying a treatment liquid through the supply nozzle 7. However, the present invention is applicable to any substrate treating apparatus that performs a predetermined treatment while rotating a substrate W.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for performing a predetermined treatment on a substrate, the apparatus comprising:
   a spin table configured to be rotatable around a vertical axis;
   a rotational driving device configured to rotate the spin table in a horizontal plane;
   a holding mechanism configured to hold the substrate in a horizontal posture while the substrate is spaced apart from a top face of the spin table, the holding mechanism including:
      a plurality of support pins provided so as to be rotatable freely around the vertical axis on a part of the top face of the spin table adjacent to an outer circumference, and configured to rotate between a holding position contacting a periphery edge of the substrate for restricting movement of the substrate in a horizontal direction, and a delivery position spaced apart from the periphery edge of the substrate for allowing movement of the substrate;

a first magnetic part configured to rotate the support pins individually between the holding position and the delivery position by switching surrounding magnetic poles; and a second magnetic part configured to rotate the support pins individually to the holding position by constantly applying a magnetic field to the first magnetic part; and a switching mechanism provided with a third magnetic part having a larger magnetic force than that of the second magnetic part and configured to apply no magnetic field of the third magnetic part to the first magnetic part when the substrate is not being delivered and to apply a magnetic field of the third magnetic part to the first magnetic part to rotate the support pins individually to the delivery position only when the substrate is delivered;

wherein the first magnetic part and the second magnetic part are located concyclically around a rotation center of the spin table in plan view.

2. The apparatus according to claim 1, wherein
the first magnetic part is connected to lower ends of the support pins protruding on a lower face of the spin table, and
the second magnetic part is located on the lower face of the spin table laterally of the first magnetic part.

3. The apparatus according to claim 2, wherein
the switching mechanism includes a lifting mechanism configured to move the third magnetic part upward and downward, and
wherein the lifting mechanism rotates the support pins to the delivery position by approaching the third magnetic part to the first magnetic part through upward movement to approach the spin table, and rotates the support pins to the holding position by moving the third magnetic part away from the first magnetic part through downward movement to move away from the spin table, the downward movement being performed when the substrate is not being delivered.

4. The apparatus according to claim 2, wherein
the third magnetic part is located closer to the rotation center of the spin table than the first magnetic part and the second magnetic part in plan view.

5. The apparatus according to claim 1, wherein
the switching mechanism includes a lifting mechanism configured to move the third magnetic part upward and downward, and
wherein the lifting mechanism rotates the support pins to the delivery position by approaching the third magnetic part to the first magnetic part through upward movement to approach the spin table, and rotates the support pins to the holding position by moving the third magnetic part away from the first magnetic part through downward movement to move away from the spin table, the downward movement being performed when the substrate is not being delivered.

6. The apparatus according to claim 1, wherein
the third magnetic part is located closer to the rotation center of the spin table than the first magnetic part and the second magnetic part in plan view.

7. The apparatus according to claim 1, further comprising:
a cover that is located so as to cover the rotational driving device below the spin table and has resistance to a treatment liquid supplied to the substrate, wherein the third magnetic part is located within the cover.

8. The apparatus according to claim 1, wherein
the spin table has a plurality of through holes penetrating from the top face to a lower face thereof, into which the support pins are individually inserted, and
the spin table includes notches that are formed such that portions thereof around the through holes are each lower than the top face and are cut out toward an outer circumferential face of the spin table.

9. The apparatus according to claim 1, wherein
the support pins each include a cylindrical shaft, and a support piece formed on an upper portion of the shaft and configured to contact a rear face and an outer periphery edge adjacent to the outer circumference of the substrate to support the substrate, and
the support piece has an elliptical shape in plan view, and a longitudinal axis of the support piece is brought into a posture along an outer periphery edge of the spin table when the support pins are rotated into the holding position.

10. A substrate treating apparatus for performing a predetermined treatment on a substrate, the apparatus comprising:
a spin table configured to be rotatable around a vertical axis;
a rotational driving device configured to rotate the spin table in a horizontal plane;
a holding mechanism configured to hold the substrate in a horizontal posture while the substrate is spaced apart from a top face of the spin table, the holding mechanism including:
a plurality of support pins provided so as to be rotatable freely around the vertical axis on a part of the top face of the spin table adjacent to an outer circumference, and configured to rotate between a holding position contacting a periphery edge of the substrate for restricting movement of the substrate in a horizontal direction, and a delivery position spaced apart from the periphery edge of the substrate for allowing movement of the substrate;
a first magnetic part configured to rotate the support pins individually between the holding position and the delivery position by switching surrounding magnetic poles; and
a second magnetic part configured to rotate the support pins individually to the holding position by constantly applying a magnetic field to the first magnetic part; and
a switching mechanism provided with a third magnetic part having a larger magnetic force than that of the second magnetic part and configured to apply no magnetic field of the third magnetic part to the first magnetic part when the substrate is not being delivered and to apply a magnetic field of the third magnetic part to the first magnetic part to rotate the support pins individually to the delivery position only when the substrate is delivered;
wherein:
the spin table includes a carrier plate on a lower face of arrangement of the support pins that is configured to support the support pins,
the carrier plate includes a first end along an arc of the spin table, a second end opposite to the first end relative to the arc of the spin table, an attachment part for the support pins, the attachment part being formed adjacent to the first end, a round screw hole formed adjacent to the first end and configured to perform screwing and fixation to the spin table, a long threaded screw hole having a longitudinal axis in a radial direction of the spin table, formed adjacent to the second end, and configured to screw to the spin table, and the first end is moved in the radial direction of the spin table while a screw in the long threaded screw hole is released for adjusting positions of the support pins in the radial direction of the spin table.

\* \* \* \* \*